United States Patent [19]  
Pierson

[11] 4,030,180  
[45] June 21, 1977

[54] LONGITUDINALLY FED COMPONENT INSERTION APPARATUS

[76] Inventor: Mark V. Pierson, 28 Ogden St., Binghamton, N.Y. 13901

[22] Filed: May 24, 1976

[21] Appl. No.: 689,249

[52] U.S. Cl. .................................. 29/741; 29/626
[51] Int. Cl.² .................................. H05K 3/30
[58] Field of Search ...... 29/203 B, 203 D, 203 DT, 29/211 R, 211 D, 626

[56] References Cited

UNITED STATES PATENTS

| | | | |
|---|---|---|---|
| 3,564,691 | 2/1971 | Ackerman | 29/203 B |
| 3,780,415 | 12/1973 | Ragard | 29/203 B |
| 3,896,533 | 7/1975 | Ullman et al. | 29/203 B |

Primary Examiner—Carl E. Hall  
Attorney, Agent, or Firm—Fidelman, Wolffe & Waldron

[57] ABSTRACT

An electronic component insertion apparatus having an inserter assembly rotatable from a drive position to a feed position where a feeding subassembly feeds a component along the longitudinal axis of the inserter assembly into the inserter and subsequently the inserter assembly is rotated back to the drive position where it is driven along its longitudinal axis to insert the component into a circuit board.

14 Claims, 9 Drawing Figures

LONGITUDINALLY FED COMPONENT INSERTION APPARATUS

BACKGROUND OF THE INVENTION

1. Field of the Invention

The present invention relates generally to electronic component insertion devices and more particularly to an improved feed mechanism for an electronic component insertion device.

2. Description of the Prior Art

Insertion machines for dual in-line electronic components have generally provided means adapted to be reciprocated between an upper or first position and a lower or insertion position, a supporting assembly adapted to position components one at a time in the path of reciprocation of the insertion means to permit the latter to engage and thereafter insert the component into a circuit board, a component supply, and means to feed components one at a time from the supply into the supporting assembly. Since the insertion means reciprocated along its longitudinal axis the feeding of the component is provided lateral to the longitudinal axis of the insertion means. An example of this system is shown in U.S. Pat. No. 3,545,064.

More sophisticated apparatus for selecting from a plurality of magazines and inserting dual in-line components is shown in U.S. Pat. No. 3,737,284. In this system the component is held by a vacuum head wherein the insertion head rotates and moves down on top of the device picking it from the vacuum head, rotating back to a vertical axis and then performing the vertical insertion of the component into the circuit board. The intermediate transfer mechanism was necessitated by using a plurality of magazines.

The insertion heads of the prior art, as described above, have not directed themselves to a positive feed mechanism which reduces the amount of motion and complication of the insertion head. Similarly the lateral feed mechanisms, as illustrated by U.S. Pat. No. 3,545,064, do not take full advantage of the versatility of the insertion mechanism since it uses a lateral instead of a longitudinal feed.

SUMMARY OF THE INVENTION

The present invention is an insertion apparatus having a longitudinal positive feed from a supply to the insertion mechanism. An electronic component whose leads are parallel and extend in the same direction substantially perpendicular to a planar surface of the component are processed one at a time into a feeding mechanism. The feeding mechanism includes a pair of opposed retainers biased towards each other and a platform assembly positioned therebetween. An insertion mechanism which reciprocates along its longitudinal axis from a first drive position to an insertion position is rotated from the drive position to the feed position adjacent the feed mechanism. The platform assembly in combination with a plunger of the insertion mechanism moves along the longitudinal axis of the insertion mechanism camming the retainers apart and allowing the component to be transferred into the insertion mechanism. The leads of the component are spread by a pair of fingers prior to the transfer. The insertion mechanism which includes a pair of opposed blades and a plunger therebetween. The plunger is extended to cooperate with the platform so as to engage the component therebetween and move it from the feed mechanism to the insertion mechanism. Once the component is transferred to the insertion mechanism the platform is retracted and the insertion mechanism is rotated back to the first or drive position. The slide of the insertion mechanism is then driven down along its longitudinal axis to a point adjacent to a circuit board. At this point the plunger is again driven so as to force the component from the insertion mechanism into holes in the circuit board. The plunger in the insertion mechanism is returned to its first position to begin the sequence anew.

OBJECTS OF THE INVENTION

Object of the present invention is to provide an electronic component insertion apparatus utilizing longitudinal feeding of the component to the insertion mechanism.

Another object of the present invention is to provide an improved insertion apparatus minimizing the number of parts and the involved movements of the parts.

A further object of the invention is to provide a positive feed mechanism wherein the components are transferred from a supply into an insertion mechanism using the minimum amount of parts and mechanized assemblies.

Still another object of the invention is to provide a dual in-line component insertion apparatus which minimizes the handling of the components and thereby reduces the probability of damage of the leads of the component.

Other objects, advantages and novel features of the present invention will become apparent from the following detailed description of the invention when considered in conjunction with the accompanying drawings.

DESCRIPTION OF THE PREFERRED EMBODIMENTS

Figure 1:
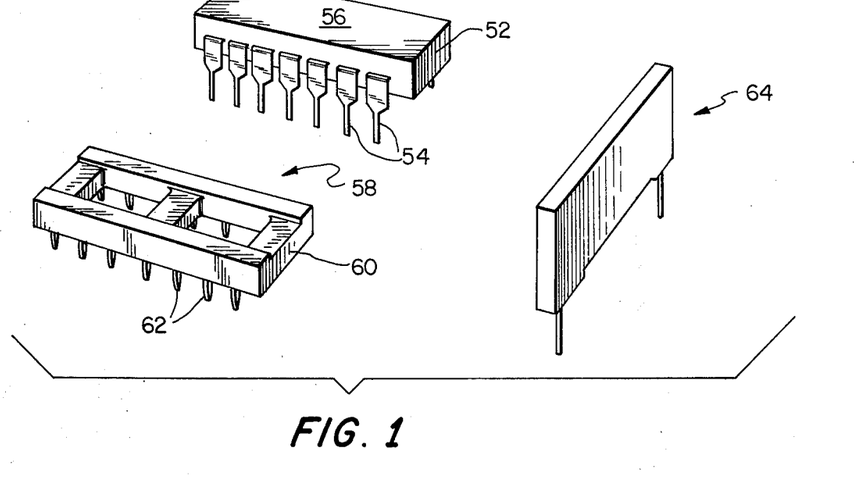
FIG. 1 is a perspective view of electronic components usable in the present invention.

The insertion apparatus of the present invention is capable of feeding and inserting electronic components whose leads are parallel and extend in the same direction substantially perpendicular to a planar surface of the electrical component. Example of three such components are illustrated in FIG. 1. Component 50 is a dual in-line component having a body portion 52 and a plurality of generally L-shaped leads 54 extending from a pair of opposite sides of the body portion. The long portion of the L-shaped leads are substantially perpendicular to the planar surface 56 of the dual in-line component. Another type of device which may be inserted, as illustrated in FIG. 1, is a lead frame 58 having a body portion 60 and a plurality of leads 62 extending parallel to each other and perpendicular to a planar portion of the body. The component 64 represents a particular shape of inductor, capacitor, resistor, etc. which may also be inserted by the present invention. Components 50, 58 and 64 are examples of the type of elements and electronic components which may be inserted by the present invention.

Figure 2:
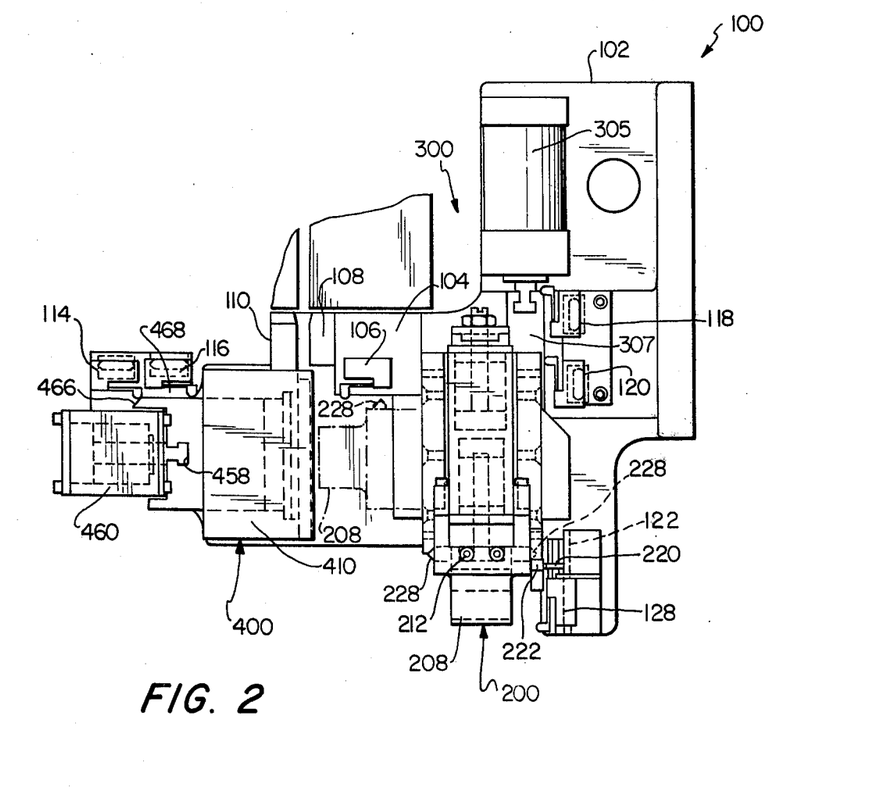
FIG. 2 is a side elevational view of the insertion apparatus of the present invention.
Figure 3:
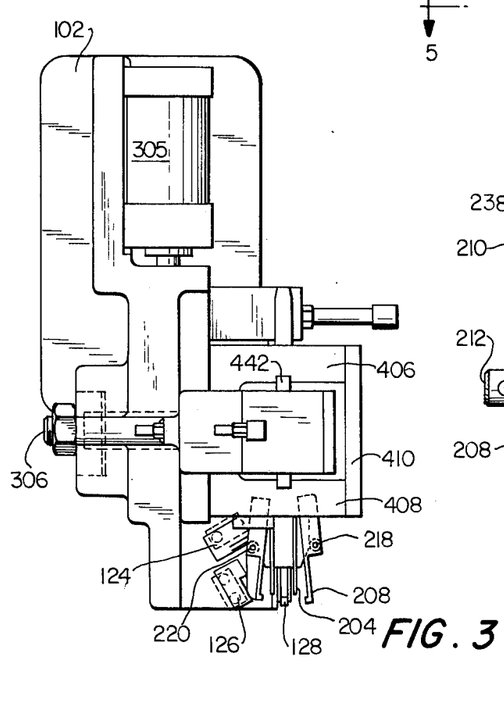
FIG. 3 is a front elevational view of the insertion apparatus of the present invention.

The insertion apparatus of the present invention 100 is shown in FIGS. 2 and 3 as including a frame 102 which supports the insertion assembly 200, a drive assembly 300 and the feed assembly 400. The insertion assembly 200 as illustrated in detail in FIGS. 4 and 5 includes a block 202 to which the elements of the assembly are mounted. A pair of opposing blades 204 are mounted to the block by a pair of fasteners 206. Adjacent to the exterior of blades 204 are a pair of opposing guides 208 which are pivotally mounted adjacent the top of block 202 by pins 210. A pair of pins 212, springs 214 and spring retainer 216 biased the guides 208 towards each other or closed. A pair of pins 218, and 220, having rollers 222 thereon, are also mounted to the guides 208. As it will be explained more fully in the description and operation of the present apparatus, rollers 222 ride on the exterior of a camming surface as to determine the open and closed position of guides 208 as required during the sequencing of the apparatus. The difference in length between pins 218 and 220, permits 200 to be used in combination with limits which detect the reciprocal motion of the insertion assembly 200.

Figure 4:
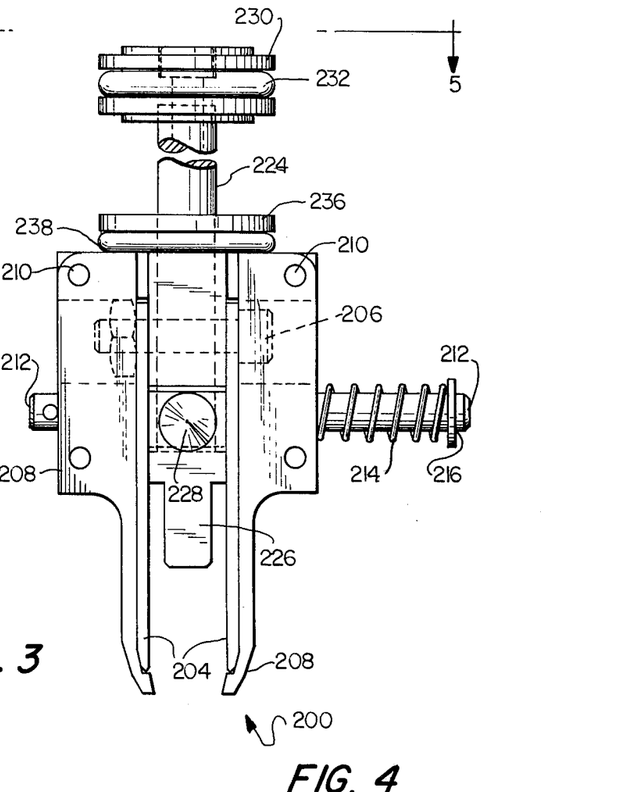
FIG. 4 is a front view of the insertion assembly 200.
Figure 5:
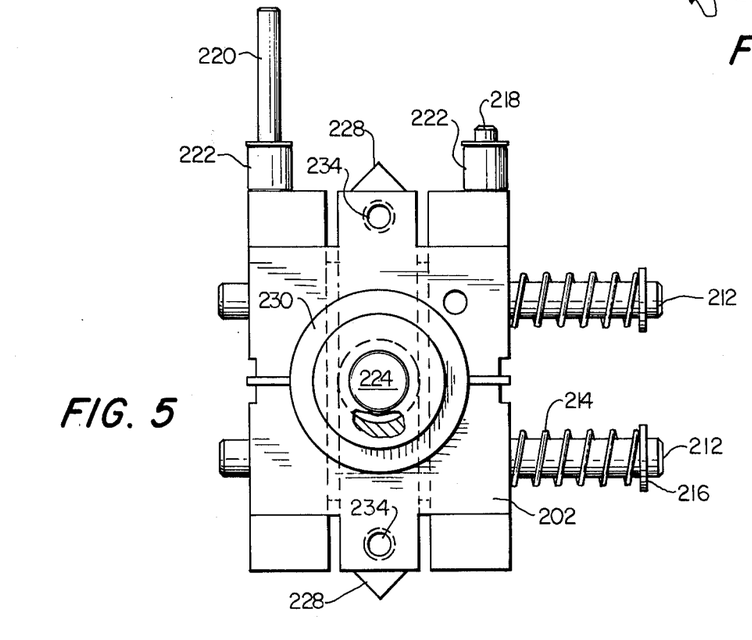
FIG. 5 is a top view of the insertion assembly 200 taken along lines 5—5 of FIG. 4.

Slidably received within the center of block 202 and between blades 204 is a plunger 224. Mounted to one end of plunger 224 is a head 226 having a pair of protrusions 228. Mounted to the other end of plunger 224 is piston 230 and O-ring 232. Piston 224 slides relative to block 202, as will be explained more fully in the description of the drive assembly 300. A pair of apertures 234 are provided, as shown in FIG. 5, in the block 202 so as to attach the block and the insertion assembly 200 to the drive assembly 300. A lip 236, which is part of the block 202, retains an O-ring 238 as shown in FIG. 4. The purpose of this will be explained more fully in the discussion of drive assembly 300.

Figures 6, 7:
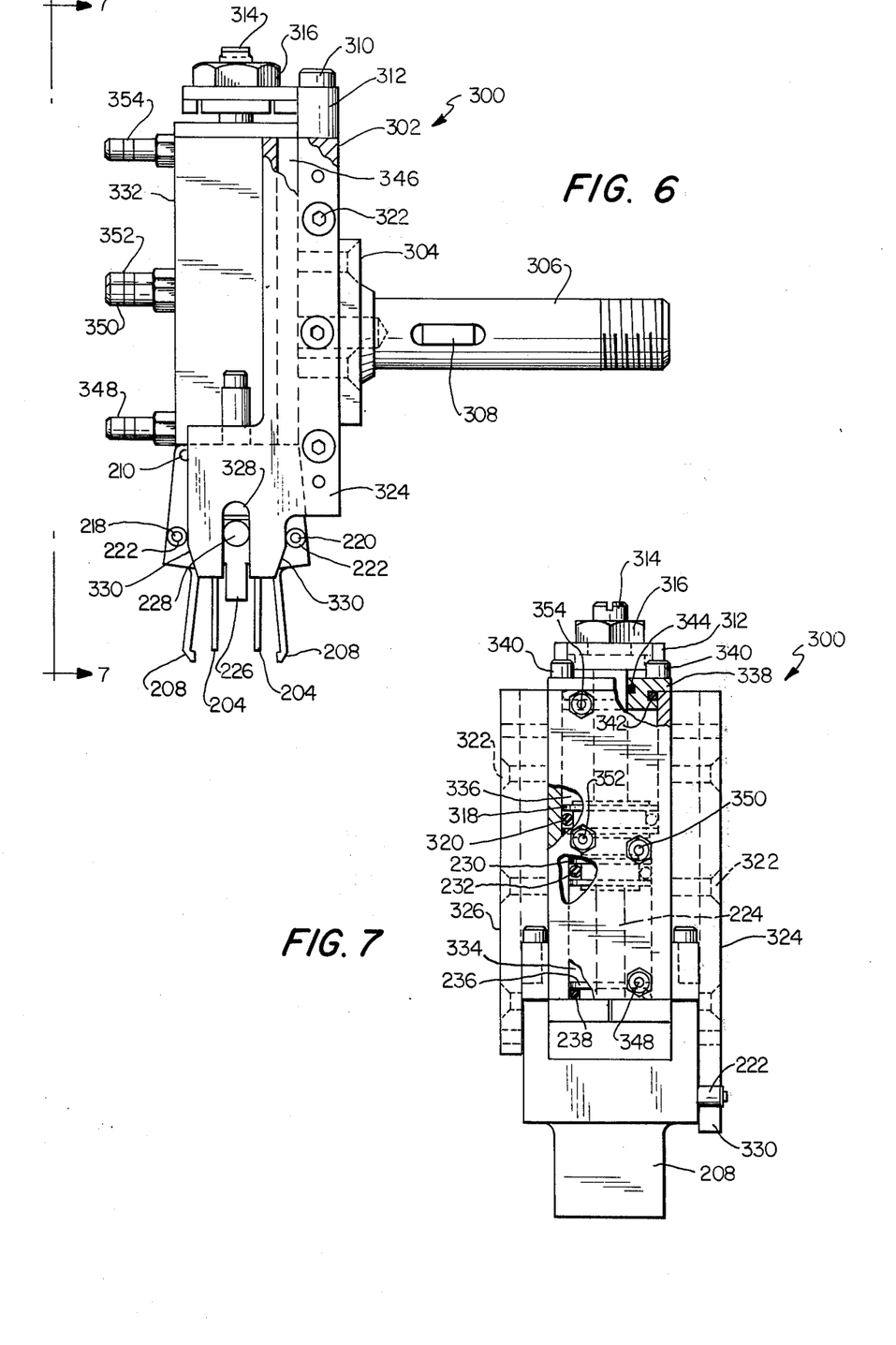
FIG. 6 is a rear view of the drive assembly 300 including the insertion assembly 200.
FIG. 7 is a side view of the drive assembly 300 taken along lines 7—7 of FIG. 6.

The drive assembly 300, as illustrated in FIGS. 6 and 7 include a slide plate 302 to which a majority of the elements of drive assembly 300 are mounted. Mounted to the rear side of slide plate 302 by fasteners 304 is a shaft 306. An elongated slot 308 or shaft 306 accommodates a fastener which secures a pinion of a rack and pinion drive to the shaft 306. As illustrated in FIG. 2, a pneumatic cylinder 305 is mounted to frame 102 and is connected to one end of rack 307. The other end of the rack and the pinion are not shown since their relationship and operation is well-known in the art. The rack and pinion causes rotation of shaft 306 which causes the drive assembly to rotate the insertion assembly between a drive position and a feed position. Mounted to the top of slide plate 302 by fastener 310 is an L-shaped slide piston retainer 312. A rod 314 is retained at one end by a nut 316 to retainer 312. At the other end of rod 314 is a piston 318 having an O-ring 320 thereon. Mounted to the sides of slide plate 302 by fasteners 222 are a pair of L-shaped guides or gibs 324 and 326. Gib 324 as illustrated in FIG. 6 includes an elongated slot 328 which receives protrusion 228 extending from a plunger head 226. Cam surfaces 330 of gib 324 cooperate with or coact with rollers 222 on pins 218 and 220 so as to open the guides 208 of the insertion assembly.

A slide 346, of the drive assembly 300, has a first chamber 334 for receiving the piston 230 of plunger 224 and a second chamber 336 for receiving the piston 318 of stationary rod 314. Block 202 of the insertion assembly forms the bottom exterior wall of chamber 334 having a seal provided by O-ring 238. The top of the second chamber 336 is closed by a top cap 338 secured thereto by fasteners 340. A gasket 342 provides a seal between the cap 338 and the slide 332 and a gasket 344 provides a seal between the cap 338 and rod 314. As illustrated specifically in FIG. 6, a rear portion 346 of slide 332 moves under a portion of the L of gibs 324 and 326. Ports 348 and 350 provide pneumatic access to the first chamber 334 of slide 332 and ports 352 and 354 provide pneumatic access to the second chamber 336 of slide 332. Air introduced in port 350 will cause the plunger 224 to move relative to the slide 332. Air introduced into port 352 will cause the slide 332 to move relative to slide plate 302. Since block 202 is mounted directly to slide 332, slide 332 may be considered part of the insertion assembly 200.

Figure 8:
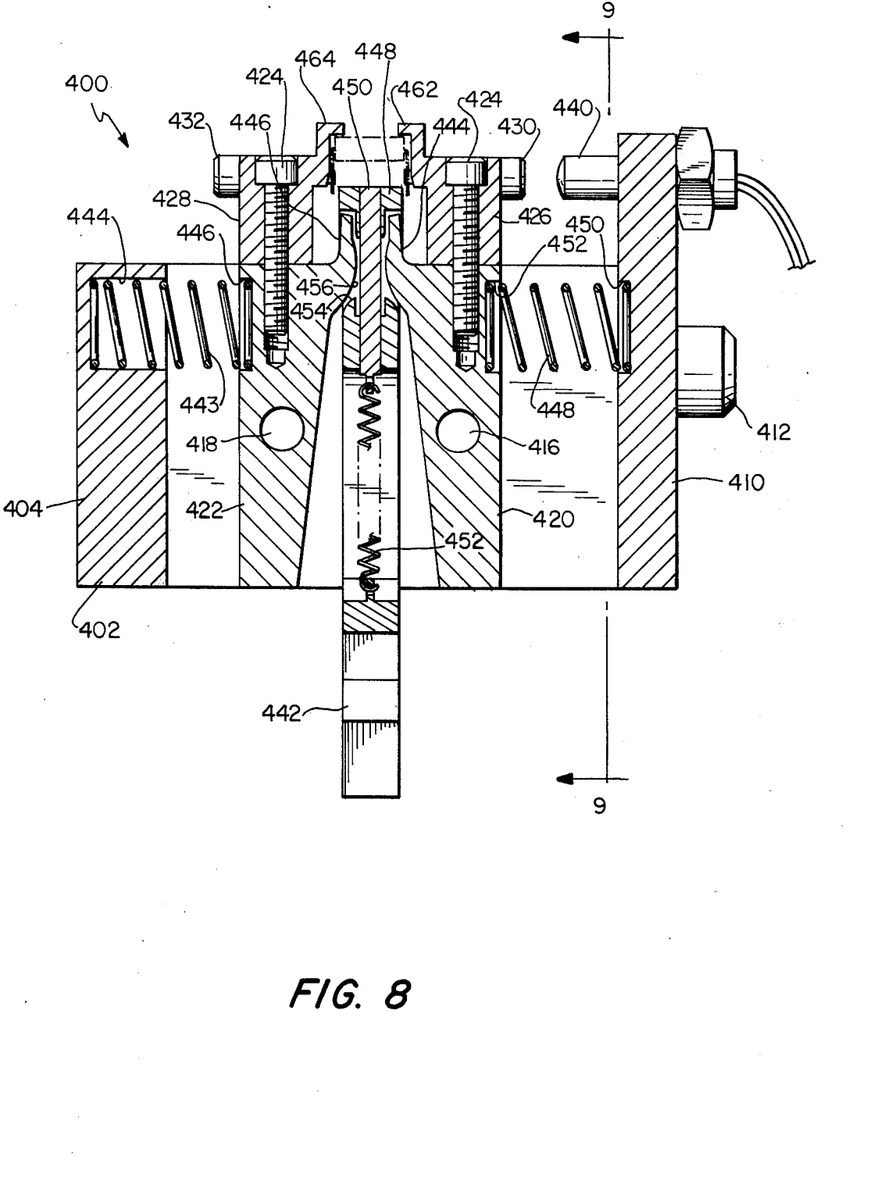
FIG. 8 is a crossectional view of the feed assembly 400.
Figure 9:
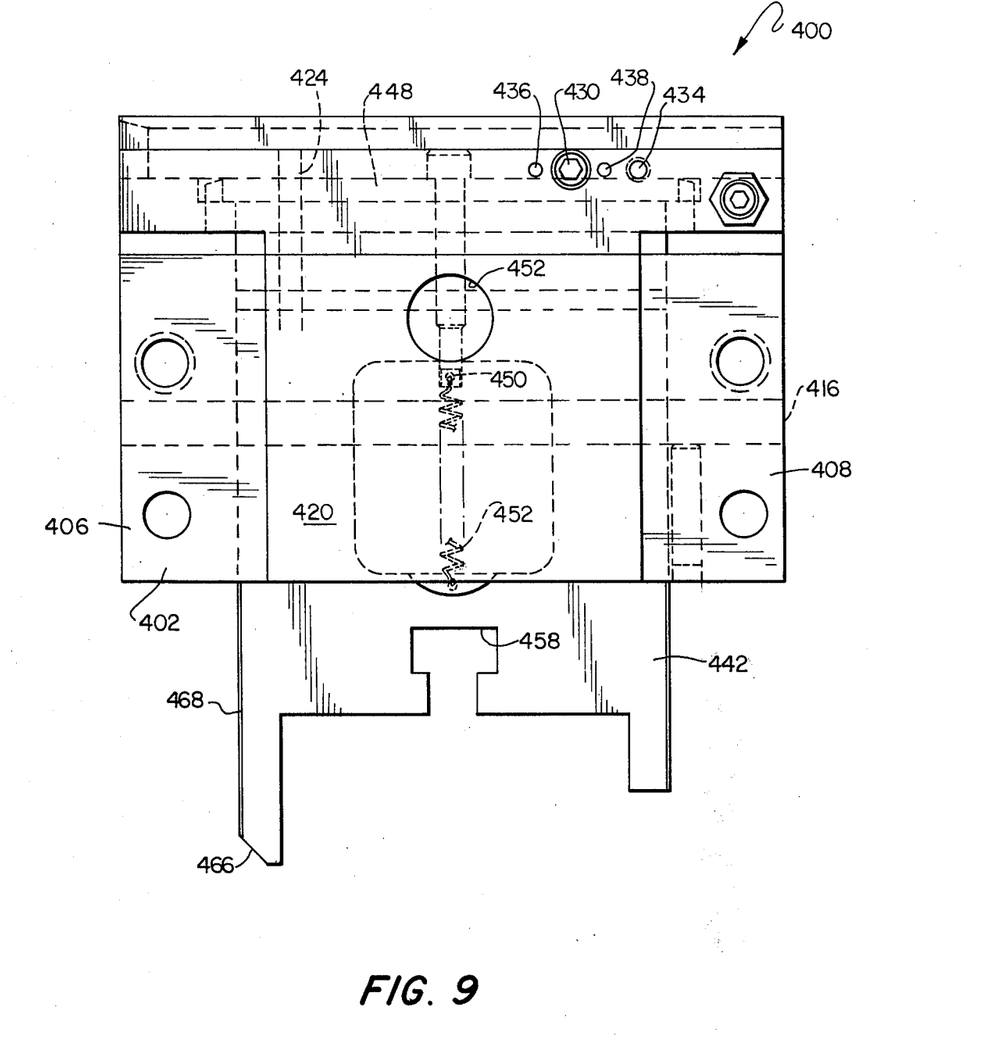
FIG. 9 is a view of the feed assembly 400 taken along lines 9—9 of FIG. 8.

The feed subassembly 400, as illustrated in FIGS. 8 and 9, includes a generally U-shaped slide block 402 having a rear wall portion 404 and sidewall portions 406 and 408. Mounted across the ends of sidewall portion 406 and 408 by fasteners 412 is a front wall or plate 410. Pivotally mounted between sidewalls 406 and 408 by pins 416 and 418 are a pair of spreaders 420 and 422 respectively. Mounted at the top of spreaders 420 and 422, by fasteners 424, are a pair of retainers 426 and 428 respectively. A pair of fasteners 430 and 432 are received in and traverse the length of retainers 426 and 428 respectively, and act as a stop to engage the leads of the component and arrest downward its motion through the retainers. As shown in FIG. 9, a second aperture 434 is provided to allow the ajustment of stop fastener 430 to accommodate for example dual in-line components of increased length. For the position shown in FIG. 9, a feed system could accommodate components having six to 20 leads and with location indicated by aperture 434 it could accommodate components having 22 to 32 leads. Apertures 436 and 438 in retainers 426 and 428 allow passage of light through to a photo detector 440 mounted to front plate 410. The two apertures correspond to the two different stop positions for fastener 430 and are used to detect hat a electronic component is in position resting on stops 430 and 432.

A spring 443 rests between a opening 444 in rear wall 404 and an opening 446 in spreader 422. A spring 448 rests between an opening 450 in plate or front wall 410 and an opening 452 in spreader 420. Springs 443 and 448 bias the spreaders 422 and 420 and their associate retainers 428 and 426 towards each other.

Movably received in slots in sidewalls 406 and 408 is a slide 442. Positioned above finger portions 444 and 446 of spreaders 420 and 422 respectively is a platform 448 having a fastener 450 connecting the platform 448 to the slide 442 by spring 452. Spring 452 allows a movement of the slide 442 independent of the movement of platform 448. Camming surfaces 454 on slide 442 coact with camming surfaces 456 on spreaders 420 and 422 to produce pivotal motion of the spreaders and their respective retainers in response to the movement of slide 422. A slot 458 in the rear of slide 442 receives the rod of a cylinder 460 illustrated in FIG. 2. A component, to be transferred from the feed assembly 400 to the insertion 200, is illustrated in phantom in FIG. 8 as having its leads resting on stops 430 and 432 and arrested from motion along the transfer path by L-shaped 462 and 464 of retainers 426 and 428 respectively.

Once the insertion assembly 200 has been rotated into the feed position adjacent retainer portions 462 and 464, plunger 226 of the insertion assembly is moved forward in to contact with the top of the body of the component. Simultaneously, or a short time thereafter, piston 460 is activated to start the motion of slide 442 along with the longitudinal axis of the insertion assembly. The initial motion of slide 442 causes camming surfaces 454 to coact with camming surfaces 456 to rotate spreaders 420 and 422 causing spreading fingers 444 and 446 to spread the leads of the electronic component. During this initial movement, the platform 448 is fixed relative to the sliding block 402. Upon continued movement, slide 440 engages the lower portion of platform 448 and drives it into contact with the bottom of the body of the electronic component such that the component is grasped or clamped between platform 448 and plunger 226. As slide 442 moves forward, the retainers 426 and 428 are further rotated allowing the component held by platform 448 and plunger 226 to move past L-shaped elements 462 and 464 of the retainers. At the forward most travelled portion of the slide 442, the component has been transferred from the feed assembly 400 to between blades 204 of the insertion assembly where it is retained by the biasing of the blades 204 towards each other. At this point in the cycle the slide 442 reverses its motion allowing the platform 448 and the slide 442 to return to its initial position as shown in FIG. 8. Springs 443 and 448 return the retainers and spreaders back to their original position as the cam surfaces 454 and 456 disengage.

Before discussing the operation of the insertion apparatus 100 of the present invention, miscellaneous elements of support 102 and the location of limit switches will be described. Referring to FIGS. 2 and 3, a stop 104 is mounted to frame 102 to define the limits of the rotational movement of the insertion assembly 200 from the drive position illustrated in FIG. 2 to the lines to feed position illustrated in FIG. 2 in the phantom lines. A limit switch 106 is mounted to stop 104 to detech the position of plunger 226 (via protusion 228) when the insertion assembly 200 is in the feed position adjacent to the feed assembly 400. A pair of elements 108 and 110, mounted to frame 102, define a chute through which the components are dispensed to the feed assembly 400. Components may be dispensed from a single magazine or from a shuttle assembly servicing a plurality of magazines. A pair of limit switches 112 and 114 detect the home and the extended postion respectively for slide 442 by riding on surfaces 466 and 468 of the slide. Limit switches 118 and 120 monitor the motion of slide 307, which is driven by piston 305, to produce rotational movement of the insertion assembly 200 between the drive and feed positions. Limit switch 118 detects the slide 307 in the top most position, and signals that the insertion assembly 200 is in the drive position. Limit switch 102 detects that slide 307 is in its downmost position and signals that insertion assembly 200 is in the feed position (the dotted line position of FIG. 2).

Pin 220 of the insertion head is received in an elongated opening 122 in the frame 102 and moves between limit switches 124 and 126 illustrated in FIG. 3. Limit switch 124 detects that the slide 332 is in its utmost or first position and limit switch 126 detects that the slide is in its bottom most position having guides 208 resting on the circuit board into which the component is to be inserted. The position of the plunger 226 driving the component from blades 204 and between guides 208 into the circuit board is detected by limit switch 128 sensing protrusions 228 of plunger 226 riding thereon.

OPERATION

The operation of the insertion apparatus 100, begins with the placement of a circuit board below the insertion head at an appropriate position for the insertion of an electronic device. Electronic components received down the chute defined by elements 108 and 110 is received in the feed assembly 400 to be retained therein by stops 430 and 432 and retainer fingers 462 and 464. The presence of a component is detected by photo-detector 440. The insertion assembly 200, being in the home or drive position as detected by limit switch 118, is then rotated 90° from the position shown in FIG. 2 to the phantom position in response to the drive of cylinder 305 and the rack and pinion. The presence of the insertion assembly 200 at the feed position is detected by 120 as the end of the stroke of cylinder 305. It should be noted that since slide 332 is in its home position, the guides 208 are open by rollers 222 riding on cam surfaces 330 of gib 324.

Once the insertion assembly 200 has been rotated into the feed position, the plunger 226 is driven forward to engage the top of the component, and slide 442 is activated to move forward allowing platform 448 to engage the bottom of the component. The extension of plunger 226 is detected by protrusion 228 engaging limit switch 106. As described previously, the initial motion of slide 442 along the longitudinal axis of the insertion assembly 200, cams spreader fingers 444 and 446 to move apart and spread the leads of the electrical components beyond their normal parallel relationship. Simultaneously therewith the L-shaped retainer members 462 and 464 are also spread apart. The continued movement of slide 442 engages the lower portion of platform 448 so as to drive the platform synchronously with the plunger 226 to transfer the component from the feed assembly 400 to the insertion assembly 200. The component with its spread leads are biased blades 204. The slide 442 reverses its motion along the longitudinal axis of the insertion assembly 200 bringing platform 448 to its home position and allowing the spreader and retainer elements to be spring biased by spring 443 and 448 to to their initial position as shown in FIG. 8. The movement of slide 442 being detected by limit switches 114 and 116.

Insertion assembly 200 is then rotated from the feed position back to the drive position. Once in the drive position, a pneumatic signal is then provided to drive the slide 332 relative to piston 318. This causes rod 222 to ride off limit 124 indicating that the slide is leaving its home position. Similarly, rollers 222 riding on cam surfaces 330 of stationary gib 324 allows the guides 208 to close, surrounding blades 204. When the slide 332 reaches its lower most position, the guides 208 come to rest on the circuit board. This position is detected by limit switch 126. A pneumatic command is then given to drive plunger 226 down forcing the component down through the guides 208 and into the holes provided in the circuit boards for the leads of the component. The final downmost position of plunger 226 is detected by limit switch 128. Upon receipt of this signal, a cut and clinch mechanism (not shown), is activated. The present process is then reversed allowing the slide 332 and plunger 226 to return to their initial position as illustrated in FIG. 2. The cycle is then repeated for feeding and inserting each of the elements. The limit switches and the cylinders illustrated are under the control of a system now shown which may include a small digital computer or a numeral control or other devices known to the art.

From the preceding description of the preferred embodiment it is evident that the objects of the invention are obtained to provide an insertion apparatus having a longitudinal means. Although the invention has been described and illustrated in detail, it is to be clearly understood that the same is by way of limitation. The spirit and scope of this invention being limited only by terms of the appended claims.

What is claimed:

1. An apparatus for inserting electronic components whose leads are parallel and extend in the same direction substantially perpendicular to a planar surface of said component, said apparatus comprising:
   component inserter means having a longitudinal axis;
   drive means for rotating said inserter means between a feed position and a drive position and for reciprocating said inserter means from a first position to an insertion position along said longitudinal axis; and
   feed means for feeding electronic components one at a time into said inserter means along said longitudinal axis when said inserter means is in said feed position.

2. The apparatus of claim 1 wherein said component inserter means includes a pair of opposed blades biased towards each other and a plunger positioned between said blades and movable along said longitudinal axis, and said feed means includes a pair of opposed retainers biased toward each other and a platform positioned between said retainers, said plunger and said platform cooperate to transfer an electronic component from said retainers to said blades along said longitudinal axis.

3. The apparatus of claim 2 wherein said plunger is also operative to transfer said electronic component from said blades onto a printed circuit board.

4. The apparatus of claim 1 wherein said component inserter means includes a plunger, and said feed means includes a pair of opposed retainers and a platform between said retainers, said plunger and said platform cooperate to transfer an electronic component from said retainers to said component inserter means along said longitudinal axis.

5. The apparatus of claim 4 wherein said retainers include a stop for arresting said electronic component in a direction perpendicular to the axis of motion of said platform, and a lip for arresting said electronic component in the direction of motion of said platform, and said feed means includes means for separating said retainers during the transfer motion of said platform.

6. The apparatus of claim 5 wherein said retainers are pivotally mounted and spring biased towards each other, and said separating means include camming surfaces on said platform and said retainers cooperating during the transfer motion of said platform to pivot said retainers apart.

7. The apparatus of claim 6 wherein said platform includes a slide, said platform is biasedly mounted to said slide and said slide includes said separating means cam surface for said platform, whereby said slide moves to separate said retainers before said platform begins to move to transfer said electronic component.

8. The apparatus of claim 1 wherein said component inserter means includes a pair of opposed blades biased towards each other and mounted to a slide and a plunger slidably mounted to said slide between said blades to move along said longitudinal axis, said drive means includes a first means for moving said slide along said longitudinal axis and a second means for independantly moving said plunger along said longitudinal axis.

9. The apparatus of claim 8 wherein said slide includes a first and a second chamber, said first means includes a stationary piston in said first chamber for moving said slide relative to said piston and said second means includes a piston in said second chamber connected to said plunger for moving said plunger relative to said slide.

10. The apparatus of claim 9 wherein said drive means includes a slide guide for said slide, said stationary piston is mounted to said guide and said guide is pivotally mounted to a support; and a third means or rotating said guide and said inserter means relative to said support.

11. The apparatus of claim 10 wherein said inserter means includes a pair of component guides pivotally mounted adjacent the external side of said blades, camming means on said component guides and on said slide guide cooperating to open said component guide when said slide is in said first position, said component guides have a plurality of opposed teeth for guiding the leads of said electronic components inwardly and downwardly into holes on a circuit board.

12. The apparatus of claim 1 including control means for sensing predetermined positions of said inserter, drive and feed means and sequencing the operation of said inserter, said drive and said feed.

13. The apparatus of claim 4 wherein said feed means includes a pair of means for spreading the leads of said electronic component before the transfer of said component from said feed means to said inserter means.

14. The apparatus of claim 13 wherein said spreading means are a pair of pivotally mounted fingers and include a cam surface and said platform includes a slide with a cam surface, said cam surfaces coact to pivot said fingers to spread said leads during the transfer motion of said slide.

* * * * *

UNITED STATES PATENT OFFICE
CERTIFICATE OF CORRECTION

PATENT NO. : 4,030,180

DATED : June 21, 1977

INVENTOR(S) : Mark V. Pierson

It is certified that error appears in the above-identified patent and that said Letters Patent are hereby corrected as shown below:

In the title block of the Patent, please insert in the next line after

[76] Inventor: Mark V. Pierson, 28 Ogden St., Binghamton, N.Y. 13901 the following:

[73] Universal Instruments Corporation Binghamton, N. Y.

Signed and Sealed this

Eighteenth Day of October 1977

[SEAL]

Attest:

RUTH C. MASON
Attesting Officer

LUTRELLE F. PARKER
Acting Commissioner of Patents and Trademarks